United States Patent
Clavelier et al.

(10) Patent No.: US 7,759,175 B2
(45) Date of Patent: Jul. 20, 2010

(54) FABRICATION METHOD OF A MIXED SUBSTRATE AND USE OF THE SUBSTRATE FOR PRODUCING CIRCUITS

(75) Inventors: Laurent Clavelier, Grenoble (FR); Cyrille Le Royer, Grenoble (FR); Jean-François Damlencourt, Saint-Egrève (FR)

(73) Assignee: Commissariat a l'Energie Atomique, Paris (FR)

( * ) Notice: Subject to any disclaimer, the term of this patent is extended or adjusted under 35 U.S.C. 154(b) by 248 days.

(21) Appl. No.: 12/071,886

(22) Filed: Feb. 27, 2008

(65) Prior Publication Data

US 2008/0220594 A1    Sep. 11, 2008

(30) Foreign Application Priority Data

Mar. 5, 2007    (FR) .................................. 07 01587

(51) Int. Cl.
  *H01L 21/02* (2006.01)
(52) U.S. Cl. ......................................... 438/149; 257/64
(58) Field of Classification Search ................ 438/149; 257/E27.064, E27.099, E27.108
See application file for complete search history.

(56) References Cited

U.S. PATENT DOCUMENTS

| | | | |
|---|---|---|---|
| 6,709,903 B2 * | 3/2004 | Christiansen et al. ........ | 438/149 |
| 7,547,595 B2 * | 6/2009 | Ning ........................... | 438/199 |
| 2004/0256700 A1 | 12/2004 | Doris et al. | |
| 2006/0292783 A1 * | 12/2006 | Lee et al. .................... | 438/199 |
| 2006/0292835 A1 * | 12/2006 | Nakaharai et al. ........... | 438/478 |
| 2007/0059875 A1 * | 3/2007 | Mishima .................... | 438/199 |
| 2007/0077773 A1 * | 4/2007 | Frohberg et al. ............ | 438/758 |
| 2007/0254440 A1 | 11/2007 | Daval | |
| 2008/0023692 A1 * | 1/2008 | Wirbeleit et al. ............. | 257/19 |
| 2008/0128746 A1 * | 6/2008 | Wang ......................... | 257/190 |
| 2008/0185617 A1 * | 8/2008 | Kuan et al. ................. | 257/288 |
| 2008/0203485 A1 * | 8/2008 | Chudzik et al. ............ | 257/369 |

FOREIGN PATENT DOCUMENTS

EP    1 811 548 A1    7/2007

(Continued)

OTHER PUBLICATIONS

Shu Nakaharai et al., "Characterization of 7-nm-thick Strained Ge-on-insulator layer facricated by Ge-condensation technique," Applied Physics Letters, vol. 83, No. 17, pp. 3516-3518, Oct. 27, 2003.

(Continued)

*Primary Examiner*—Thao P. Le
(74) *Attorney, Agent, or Firm*—Oliff & Berridge, PLC

(57) ABSTRACT

The fabrication method of a mixed substrate comprising a tensile strained silicon-on-insulator portion and a compressive strained germanium-on-insulator portion comprises a first step of producing a strained silicon-on-insulator base substrate comprising first and second tensile strained silicon zones. After the base substrate has been produced, the method comprises the successive steps of masking the first tensile strained silicon zone forming the tensile strained silicon-on-insulator portion of the substrate, of performing germanium enrichment treatment of the second tensile strained silicon zone of the base substrate until a compressive strained germanium layer is obtained forming said compressive strained germanium-on-insulator portion of the substrate, and of removing the masking.

12 Claims, 2 Drawing Sheets

FOREIGN PATENT DOCUMENTS

| | | |
|---|---|---|
| FR | 07 53146 | 2/2007 |
| WO | WO 2006/043471 A1 | 4/2006 |
| WO | WO 2006/090201 A2 | 8/2006 |

OTHER PUBLICATIONS

Tsutomu Tezuka et al., "Ultrathin Body SiGe-on-Insulator pMOSEFTs With High-Mobility SiGe Surface Channels," IEEE Transactions on Electron Devices, vol. 50, No. 5, pp. 1328-1333, May 2003.

O. Weber et al., "Strained Si and Ge MOSFETS with High-K/Metal Gate Stack for High Mobility Dual Channel CMOS," Tech. Digest, pp. 143-146, 2005.

Tsutomu Tezuka et al., "Strained-SOI/SGOI Dual Channel CMOS Technology Based on Ge Condensation Technique," Third International SiGe Technology and Device Meeting, pp. 1-2, 2006.

* cited by examiner

FABRICATION METHOD OF A MIXED SUBSTRATE AND USE OF THE SUBSTRATE FOR PRODUCING CIRCUITS

BACKGROUND OF THE INVENTION

The invention relates to a fabrication method of a mixed substrate comprising at least one tensile strained silicon-on-insulator portion and at least one compressive strained germanium-on-insulator portion.

The invention also relates to use of a substrate obtained by one such fabrication method for producing CMOS circuits comprising at least one N-MOS component produced on the tensile strained silicon-on-insulator portion of substrate and at least one P-MOS component produced on the compressive strained germanium-on-insulator portion of substrate.

STATE OF THE ART

The race for performance (current level, speed, etc.) in silicon-based microelectronics is in particular pushing for increasing miniaturization of the size of transistors. In parallel with this miniaturization phenomenon, approaches have been proposed for introducing new materials, in particular high-mobility materials such as germanium, and for introducing mechanical strains, a tensile strain enhancing electron transport and a compressive strain enhancing transport by holes in the case of silicon and germanium.

The basic elements of CMOS (Complementary Metal Oxide Semiconductor) microelectronics are the N-MOS transistor, i.e. a transistor with electron conduction, and the P-MOS transistor, i.e. a transistor with hole conduction. These two types of transistors are generally associated to perform logic functions, for example OR, AND, NOR, NAND gates, etc., or memory dots, for example SRAM-6T. All the components for 'general public' microelectronics are at present made on silicon substrates.

On account of the ratio of volumic mobilities between electrons and holes in silicon, respectively 1500 $cm^2/V/s$ and 500 $cm^2/V/s$, the electrical characteristics of N-MOS and P-MOS transistors present dissymmetries and P-MOS transistors have much lower performances than N-MOS transistors, notably in terms of current output and speed.

Co-integration of a silicon N-MOS transistor and a germanium P-MOS transistor on the same substrate is one means of improving the characteristics of the P-MOS transistor in the CMOS circuit, but also of balancing N-type and P-type transistors both in terms of current level and in terms of time constants without losing any space. The volumic mobility of holes in germanium is in fact about 1900 $cm^2/V/s$ and that of electrons in silicon is close to 1500 $cm^2/V/s$. N-type and P-type transistors of the same dimensions can therefore be fabricated, having almost the same electrical characteristics.

To achieve such transistors, the fabrication technique by enrichment with germanium has been extensively described, in particular in the articles "Ultra-thin body SiGe-on-Insulator p-MOSFETs with high mobility SiGe surface channels" by T. Tezuka et al. (EDL 2002, vol. 50, No 5, pp 1328-1333, 2003) and "Characterization of 7-nm-thick strained Ge-on-insulator layer fabricated by Ge-condensation technique" by Nakaharai et al. (Applied Physics Letters, Volume 83, Number 17, 2003).

However fabrication of a germanium-on-insulator GeOI substrate, i.e. any $Si_{1-X}Ge_X$OI layer with the germanium concentration X greater than or equal to 0.8, by the germanium enrichment technique involves producing a prestructure formed by a $Si_{1-X}Ge_X$ layer deposited on a silicon-on-insulator SOI substrate. The more the substrate is enriched with germanium, the greater the lattice mismatch that will exist between the enriched silicon and germanium alloy layer and the underlying silicon layer of the silicon-on-insulator SOI substrate. Relaxation of the strain of the enriched layer will not be observed so long as the enriched layer has not exceeded a thickness called the "critical plastic relaxation thickness". Beyond this thickness, the layer relaxes its strain progressively by creation of structural defects of the dislocation type. Moreover the critical plastic relaxation thickness is all the smaller the higher the germanium concentration of the enriched $Si_{1-X}Ge_X$ layer. The germanium enrichment technique on a silicon-on-insulator SOI substrate therefore presents a technical limitation, i.e. relaxation of the strains and the appearance of defects during enrichment.

To remedy the above drawbacks, it has been proposed to use strained Silicon-on-insulator substrates (sSOI). These substrates are Silicon-on-insulator (SOI) substrates whose upper silicon membrane is tensile strained by modification of its lattice parameter.

More particularly, the idea and interest of producing N-MOS transistors on tensile strained silicon and P-MOS transistors on compressive strained germanium have already been proposed and described, in particular in the article "Strained-SOI SGOI Dual Channel CMOS Technology Based on Ge Condensation Technique" by T. Tezuka et al. (Third International SiGe Technology and Device Meeting (ISTDM), 2006). The article describes a technique using a germanium enrichment process to perform co-integration of silicon-on-insulator (SOI) and germanium-on-insulator (GeOI) to respectively produce N-MOS components and P-MOS components.

However, the initial substrate in the above method is a substrate made from relaxed silicon and germanium on insulator (SiGeOI) which, in certain places, is enriched with germanium until germanium-on-insulator (GeOI) is obtained. The mechanical strain is not guaranteed to be kept in this approach. Moreover, the silicon zones dedicated to achieving N-MOS components are obtained by silicon epitaxy on the initial silicon and germanium on insulator (SiGeOI) substrate. This approach therefore does not enable the two germanium and silicon channels to be obtained on the same plane and therefore does not enable very thin silicon layers to be obtained, which are in particular interesting for fully depleted technologies to reduce short channel effects.

Furthermore, in the article "Strained Si and Ge MOSFETs with High-K/Metal Gate Stack for High Mobility Dual Channel CMOS" by O. Weber et al. (IEDM Tech. Digest, pp. 143-146, 2005), another technique has been proposed for producing a substrate using a strained silicon-on-insulator substrate or a pseudo substrate made of 50% relaxed silicon and germanium alloy, i.e. with epitaxial deposition of a very thick layer of silicon and germanium alloy on a silicon wafer to then produce silicon epitaxial zones for fabricating N-MOS components or germanium epitaxial zones for fabricating P-MOS components.

However, such a technique does not enable a CMOS circuit presenting optimal characteristics to be achieved, the N-MOS and P-MOS components are in particular produced on zones of strained silicon and strained germanium obtained by heteroepitaxy. Such zones are therefore not "on insulator" and on thin film, which does not enable electrostatic control of the subsequently produced components to be guaranteed.

OBJECT OF THE INVENTION

The object of the invention is to remedy all the above-mentioned drawbacks and has the object of providing a fabrication method of a mixed substrate which enables a tensile strain to be induced on a silicon-on-insulator portion of the substrate and a compressive strain to be induced on a germanium-on-insulator portion of the substrate, a method which is simple to perform while at the same time achieving a maximum reduction of the defect rate of the substrate.

According to the invention, this object is achieved by the fact that, after the strained silicon-on-insulator base substrate has been produced, the method comprises the following successive steps of:
    masking the first tensile strained silicon zone of the base substrate, forming the tensile strained silicon-on-insulator portion of the substrate,
    germanium enrichment treatment of the second tensile strained silicon zone of the base substrate until said compressive strained germanium-on-insulator portion of the substrate is obtained,
    removal of the masking.

A further object of the invention is the use of a mixed substrate obtained by one such fabrication method for producing CMOS circuits, comprising at least one N-MOS component produced on the tensile strained silicon-on-insulator portion of the substrate and at least one P-MOS component produced on the compressive strained germanium-on-insulator portion of the substrate.

BRIEF DESCRIPTION OF THE DRAWINGS

Other advantages and features will become more clearly apparent from the following description of a particular embodiment of the invention given for non-restrictive example purposes only and represented in the accompanying drawings, in which.

DESCRIPTION OF PARTICULAR EMBODIMENTS

Figure 2:
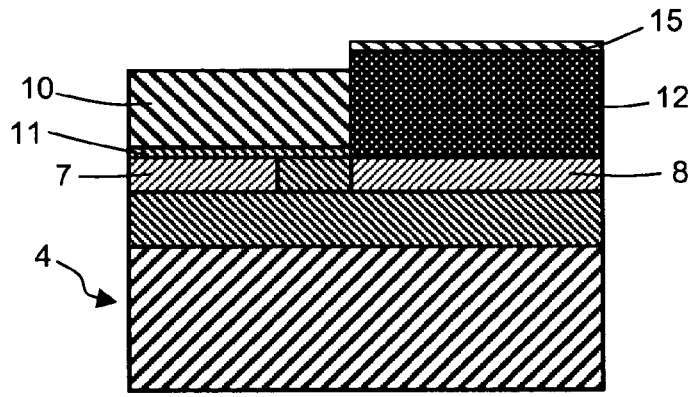
Figure 3:
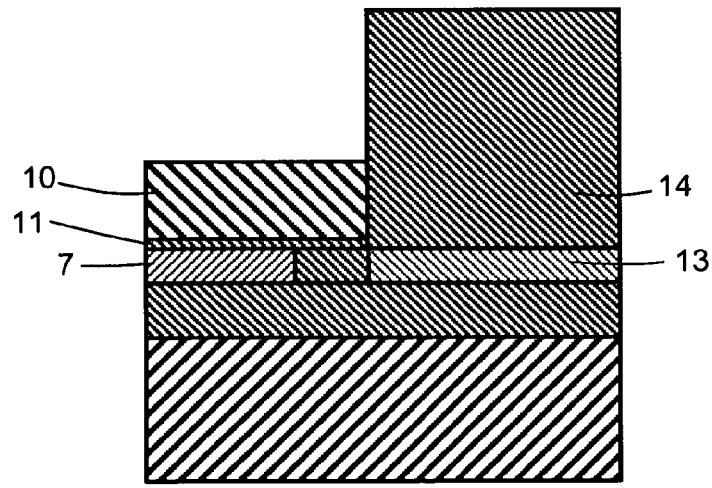
Figure 4:
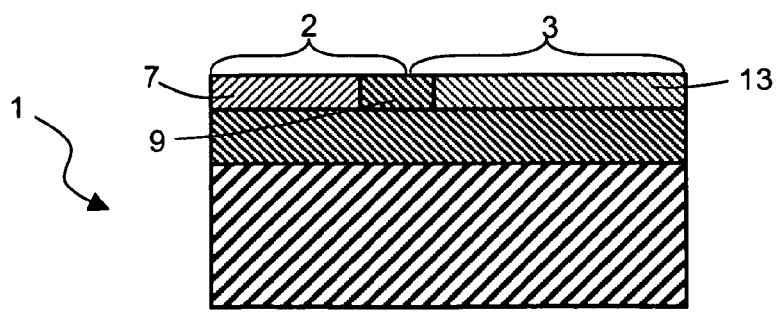

With reference to FIGS. 1 to 6, the fabrication method according to the invention is designed in particular to achieve a mixed substrate 1, i.e. presenting at least one tensile strained silicon-on-insulator (sSOI) portion 2, co-integrated with at least one compressive strained germanium-on-insulator (sGeOI) portion 3 (FIG. 4). Such a substrate 1 is more particularly designed for producing CMOS (Complementary Metal Oxide Semiconductor) circuits, tensile strained silicon-on-insulator portion 2 being designed for producing components, for example a transistor, of N-MOS type and compressive strained germanium-on-insulator portion 3 being designed for producing components, for example a transistor, of P-MOS type.

Figure 1:
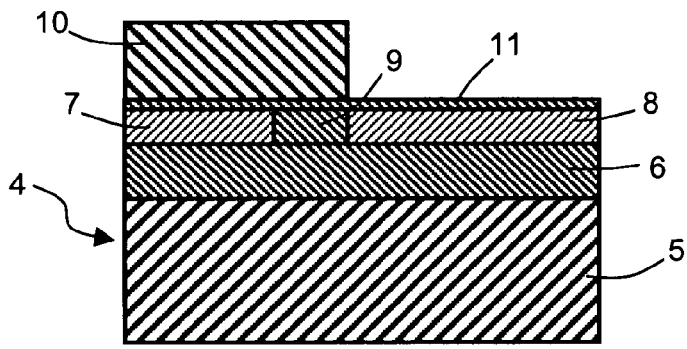
FIGS. 1 to 4 schematically represent different successive steps of a particular embodiment of a mixed substrate fabrication method according to the invention.

In FIGS. 1 to 4, the fabrication method consists more particularly in using a localized germanium enrichment technique, preferably by localized thermal oxidation treatment, applied on a strained silicon-on-insulator sSOI substrate. In FIG. 1, the first step of the method consists in producing a base substrate 4 made of strained silicon-on-insulator (sSOI) presenting a silicon layer 5, a buried oxide layer 6 and a top membrane above oxide layer 6, preferably comprising two tensile strained silicon zones 7, 8 advantageously separated by at least one lateral insulating zone 9.

First tensile strained silicon zone 7 (FIG. 1) of base substrate 4 forms strained silicon-on-insulator portion 2 of substrate 1 (FIG. 4) on which at least one N-MOS component is designed to be produced. Second tensile strained silicon zone 8 of base substrate 4 is designed to be transformed to obtain compressive strained germanium-on-insulator portion 3 on which at least one P-MOS component is designed to be produced.

Figure 5:
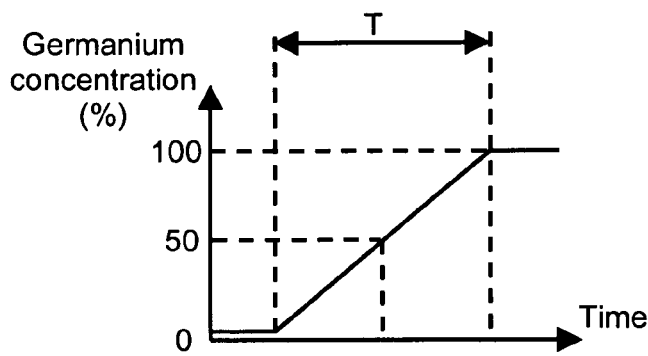
FIG. 5 is a graph illustrating the progression of the germanium concentration versus time of a silicon and germanium alloy layer during a germanium enrichment step, to obtain a portion of the substrate according to FIGS. 1 to 4.

In the particular embodiment of the method represented in FIGS. 1 to 4, tensile strained silicon-on-insulator base substrate 4 is obtained for example from a layer of silicon and germanium alloy $Si_{1-Y}Ge_Y$, with a germanium concentration Y advantageously comprised between 20% and 60%, preferably about 50% (FIG. 5). Each silicon zone 7, 8 forming the top membrane of base substrate 4 is then tensile strained, i.e. the silicon lattice parameter is modified and is equivalent to the surface lattice parameter of the silicon and germanium alloy $Si_{1-Y}Ge_Y$ layer used for fabricating base substrate 4. Classically, silicon zones 7, 8 and silicon and germanium alloy have, in a plane parallel to the substrate 4, the same lattice parameter called surface lattice parameter.

In FIG. 1, after strained silicon-on-insulator base substrate 4 has been achieved, the fabrication method comprises a masking step of first tensile strained silicon zone 7. The masking step is performed for example by deposition and patterning of a layer 10 impermeable to oxygen, in other words not reactive to oxygen, and resistant to the thermal budget of an oxidation step of a germanium enrichment process. For example, masking layer 10 is made from silicon nitride.

In the particular embodiment represented in FIGS. 1 to 4, before the above masking step, the fabrication method advantageously comprises deposition of an etch stop layer 11, for example of silicon oxide, designed in particular to stop the different etchings performed at the end of the method, which are necessary for obtaining the final substrate 1, as represented in FIG. 4.

In FIG. 2, the next step of the method consists in performing a transformation of tensile strained silicon zone 8 by a germanium enrichment technique, more particularly thermal oxidation treatment, localized solely on tensile strained silicon zone 8. In conventional manner, such a germanium enrichment process by thermal oxidation treatment first comprises deposition, for example by selective epitaxy, of a silicon and germanium alloy $Si_{1-X}Ge_X$ layer 12 on tensile strained silicon zone 8 not masked by silicon nitride layer 10.

In the particular embodiment of FIG. 2, the method advantageously comprises a deposition step of an additional silicon layer 15 formed above silicon and germanium alloy $Si_{1-X}Ge_X$ layer 12. Additional silicon layer 15 is monocrystalline with a thickness for example of a few angstroms to a few nanometers. Additional layer 15 serves the purpose in particular of forming a thin layer of silicon oxide $SiO_2$ on the top of the localized zone of base substrate 4, preventing germanium consumption during the thermal oxidation step of the germanium enrichment process, in the case of germanium enrichment by thermal oxidation treatment.

In FIG. 3, the fabrication method then comprises germanium enrichment of thus deposited layer 12 by thermal oxidation treatment until a compressive strained germanium layer 13, with a silicon oxide layer 14 on top of it, is obtained.

Figure 6:
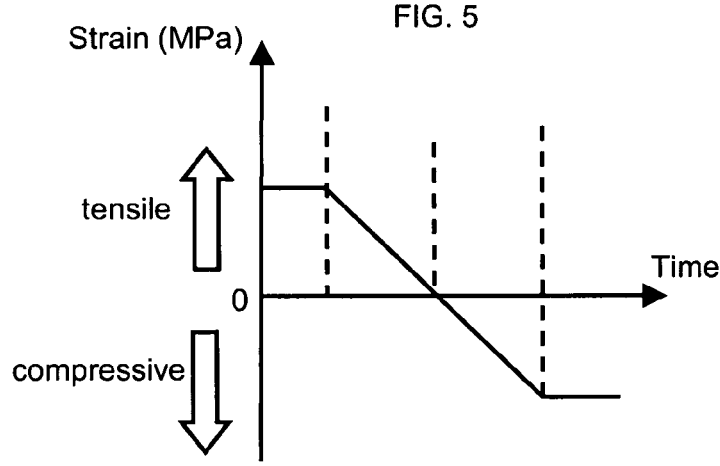
FIG. 6 is a graph illustrating the progression of the corresponding strain versus time of the silicon and germanium alloy layer according to FIG. 5.

Moreover, as represented more particularly in FIGS. 5 and 6 respectively illustrating the progression of the germanium concentration versus time and the progression of the corresponding strain versus time during the time T of the germanium enrichment process of silicon and germanium alloy $Si_{1-X}Ge_X$ layer 12, the latter goes from a tensile strain to a compressive strain (FIG. 6).

In FIG. 5, so long as the germanium concentration X of layer 12 is lower than the concentration Y corresponding to the strain of silicon zone 8 of base substrate 4, i.e. 50% in the particular embodiment represented in FIG. 5, silicon and germanium alloy $Si_{1-X}Ge_X$ layer 12 is tensile strained (FIG. 6). When the concentration X of layer 12 becomes greater than the concentration Y, i.e. 50% in the particular embodiment represented in FIG. 5, then silicon and germanium alloy $Si_{1-X}Ge_X$ layer 12 is compressive strained enabling a compressive strained germanium layer 13 to be obtained at the end of the germanium enrichment process.

Furthermore, in FIGS. 5 and 6, when the concentrations 1-X and 1-Y are equal, silicon and germanium alloy $Si_{1-X}Ge_X$ layer 12 then passes via a non mechanically strained state, i.e. layer 12 is not strained.

In FIG. 4, the last step of the method consists in finally removing, preferably by etching, both silicon oxide layer 14 originating from the germanium enrichment process described above in the case of germanium enrichment by thermal oxidation treatment, and also silicon nitride layer 10 acting as mask. Substrate 1 thus obtained is therefore a mixed substrate formed by tensile strained silicon-on-insulator (sSOI) with a tensile strained silicon layer 7, and compressive strained germanium-on-insulator (sGeOI) with a compressive strained germanium layer 13. Substrate 1 thus obtained is then suitable more particularly for achieving CMOS circuits with N-MOS components produced on tensile strained silicon layer 7 and P-MOS components produced on compressive strained germanium layer 13.

Such a fabrication method of a mixed substrate 1, as described above, therefore presents the advantage in particular of having no or few structural defects, in particular due to the use of a strained silicon-on-insulator base substrate 4.

Figure 7:
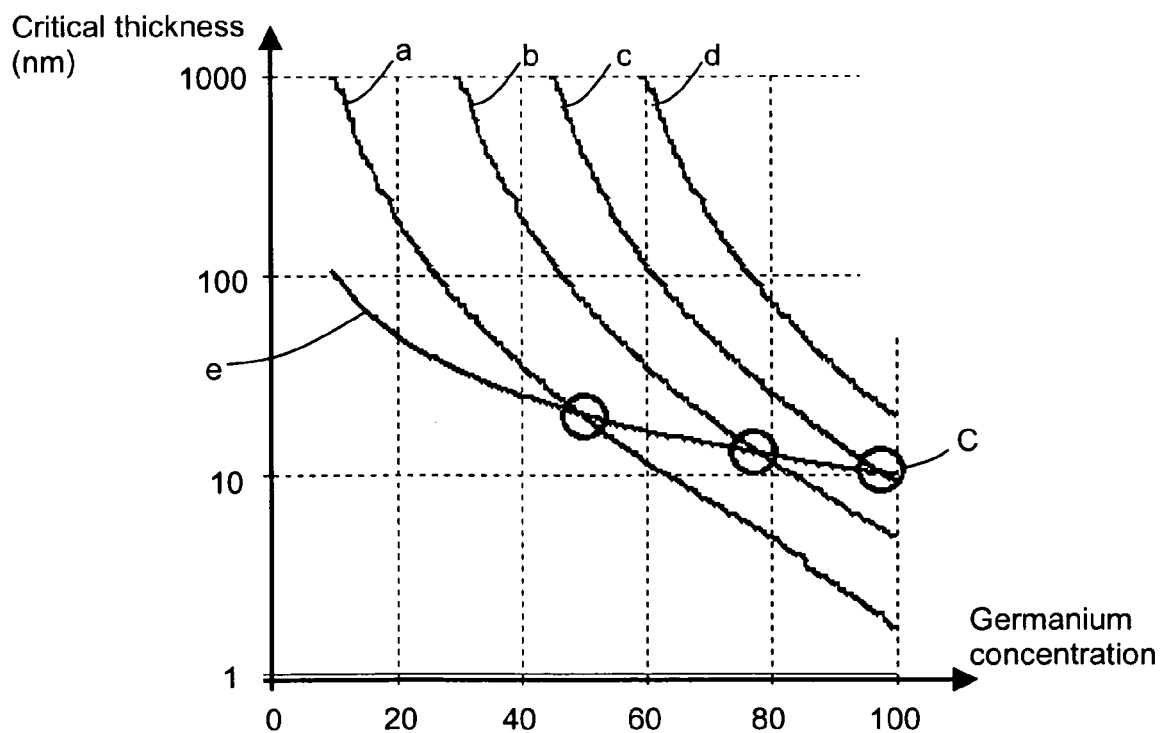
FIG. 7 is a graph of the critical plastic relaxation thickness of a silicon and germanium alloy deposited on a substrate made from non-strained silicon or silicon-on-insulator (curve a), from 20% strained silicon-on-insulator (curve b), i.e. with a surface lattice parameter identical to the lattice parameter of a silicon and germanium alloy comprising 20% of germanium, from 35% strained silicon-on-insulator (curve c), and from 50% strained silicon-on-insulator (curve d), curve e representing the progression of the concentration and thickness of the germanium-enriched layer versus the enrichment.

Indeed, FIG. 7 describes the particular case of an initial substrate 4 with a silicon and germanium alloy $Si_{1-X}Ge_X$ layer, with the germanium concentration X equal to 0.1 and a layer thickness of 100 nm. More particularly, FIG. 7 represents the critical plastic relaxation thickness of a silicon and germanium alloy $Si_{1-X}Ge_X$ deposited on a substrate made from non-strained silicon or silicon-on-insulator (curve a), 20% strained silicon-on-insulator (curve b), i.e. presenting a surface lattice parameter identical to the lattice parameter of a silicon and germanium alloy SiGe comprising 20% of germanium, from 35% strained silicon-on-insulator (curve c), and from 50% strained silicon-on-insulator (curve d). Curve e represents the progression of the concentration and thickness of the germanium-enriched layer versus the enrichment, i.e. illustrating conservation of the quantity of germanium during the enrichment process, i.e. 10% of germanium in FIG. 7 and a layer thickness of 100 nm.

It is therefore apparent from FIG. 7 that, for curves a to c, dislocations appear in the substrate due to relaxation of the strains as soon as curve e crosses curves a to c, i.e. at the level of the circles C represented in FIG. 7. For curve d, no strain relaxation is observed, as there is no intersection between curve d and curve e. Enrichment can therefore be obtained up to 100% without strain relaxation.

It is therefore apparent from FIG. 7 that the more strained silicon-on-insulator base substrate 4 is, the higher the relaxation limit, i.e. the intersection with curve e in FIG. 7, is pushed and the closer it approaches 100%. This value is in particular reached for a silicon-on-insulator substrate having a strain equivalent to silicon heteroepitaxy on a silicon alloy layer with about 40% germanium and for a base substrate 4 comprising a silicon and germanium alloy layer with a thickness of 100 nm and with 10% germanium. This therefore results in the use of such a strained silicon-on-insulator base substrate 4 enabling a substrate 1 with a germanium-on-insulator layer able to have a thickness of 10 nm to be obtained without strain relaxation and therefore without dislocations appearing.

Moreover, mixed substrate 1 obtained by the method according to the invention presents optimal characteristics from a constituent materials point of view, in particular due to the absence of defects due to strain relaxation, enabling production of N-MOS and P-MOS components to be optimized. The fabrication method thereby enables the defect rate to be reduced to the greatest possible extent and enables the mechanical strain to be preserved both in the silicon-on-insulator portion and in the germanium-on-insulator portion during enrichment without any mechanical strain relaxation occurring.

Moreover, mixed substrate 1 obtained by the method according to the invention presents a substantially flat top surface enabling coplanar N-MOS and P-MOS components to be produced. This results in optimization of the characteristics of the associated CMOS circuit.

In an alternative embodiment, not represented, wherein the top surface of substrate 1 obtained in this way turns out not to be totally flat, an additional epitaxy resumption step can be performed on compressive strained germanium-on-insulator portion 3 or on tensile strained silicon-on-insulator portion 2. In a general manner, the thinnest layer, whether it be made of silicon or germanium, can be thickened by homoepitaxy. It is therefore possible to obtain a substrate 1 with a perfectly flat top surface, which is of great interest from the point of view of lithography tools which present increasingly small field depths with time.

The invention is not limited to the different embodiments described above. Strained silicon-on-insulator base substrate 4 can be achieved by any known fabrication technique and can comprise a plurality of tensile strained silicon zones and a plurality of lateral insulation zones. Masking layer 10 can be made from any other material.

Compressive strained germanium-on-insulator portion 3 of substrate 1 can in particular be obtained by any type of germanium enrichment process. In particular, germanium-on-insulator portion 3 can be obtained by a selective silicidation enrichment process, as described in French Patent Application no 07 53146 of Feb. 8, 2007. Such a process consists in particular of performing a deposition step of a layer of a metallic element, able to selectively form a silicide, on a silicon and germanium alloy layer, and in then performing a reaction step, for example annealing or oxidation treatment, between said silicon and germanium alloy layer and said metallic element layer. Such steps then enable a superposition of metal silicide and germanium-on-insulator layers to be obtained, removal of the silicide layer then enabling compressive strained germanium-on-insulator portion 3 to be obtained.

Lateral insulation zones 9 can be fabricated before or after the germanium enrichment step.

Substrate 1 obtained by such a fabrication method can in particular be used for any other application requiring a mixed substrate presenting a tensile strained silicon-on-insulator portion and a compressive strained germanium-on-insulator portion.

The invention claimed is:

1. A fabrication method of a mixed substrate comprising:
producing a strained silicon-on-insulator substrate comprising at least a first and a second tensile strained silicon zones,
masking the first zone,
performing a germanium enrichment treatment on a tensile strained silicon layer in the second tensile strained silicon zone to form a strained germanium-on-insulator zone in place of the silicon-on-insulator zone, whereby the second zone is compressively strained, and
removing the masking, the first zone still being a tensile strained zone.

2. The method according to claim 1, wherein performing the germanium enrichment treatment comprises a thermal oxidation treatment step.

3. The method according to claim 2, wherein masking the first zone comprises deposition and patterning of a layer made from a material that is non-reactive to oxygen.

4. The method according to claim 3, wherein said layer of non-reactive to oxygen material is made from silicon nitride.

5. The method according to claim 2, wherein the thermal oxidation treatment step comprises a deposition step of a silicon and germanium alloy layer followed by a deposition step of an additional silicon layer.

6. The method according to claim 1, wherein performing the germanium enrichment treatment comprises a selective silicidation enrichment treatment step.

7. The method according to claim 1, comprising deposition of an etch stop layer on the substrate before masking the first zone.

8. The method according to claim 7, wherein the etch stop layer is an oxide layer.

9. The method according to claim 1, wherein the strained silicon-on-insulator substrate comprises at least one lateral insulation zone formed between the first and second tensile strained silicon zones before masking the first zone.

10. The method according to claim 1, wherein the strained silicon-on-insulator substrate comprises at least one lateral insulation zone formed between a tensile strained silicon-on-insulator portion and a compressive strained germanium-on-insulator portion after removing the masking.

11. The method according to claim 1, comprising an epitaxy resumption step on a compressive strained germanium-on-insulator portion or on a tensile strained silicon-on-insulator portion.

12. A method of producing CMOS circuits comprising:
providing the substrate obtained by the fabrication method according to claim 1 with at least one N-MOS component produced on a tensile strained silicon-on-insulator portion of the substrate and at least one P-MOS component produced on a compressive strained germanium-on-insulator portion of the substrate.

* * * * *